United States Patent
Wang et al.

(10) Patent No.: US 12,063,048 B2
(45) Date of Patent: Aug. 13, 2024

(54) SYSTEM FOR AND METHOD OF DIGITAL TO ANALOG CONVERSION FREQUENCY DISTORTION COMPENSATION

(71) Applicant: AVAGO TECHNOLOGIES INTERNATIONAL SALES PTE. LIMITED, Singapore (SG)

(72) Inventors: John Szeming Wang, San Jose, CA (US); Kadir Dinc, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 351 days.

(21) Appl. No.: 17/513,608

(22) Filed: Oct. 28, 2021

(65) Prior Publication Data
US 2023/0138082 A1    May 4, 2023

(51) Int. Cl.
| | |
|---|---|
| H03M 1/06 | (2006.01) |
| H03H 17/06 | (2006.01) |
| H04B 1/04 | (2006.01) |
| H03H 17/00 | (2006.01) |

(52) U.S. Cl.
CPC .......... H03M 1/0602 (2013.01); H03H 17/06 (2013.01); H04B 1/04 (2013.01); *H03H 2017/0081* (2013.01)

(58) Field of Classification Search
CPC ...... H04B 1/0017; H04B 1/04; H04B 1/0475; H03M 1/0602; H03M 1/0604; H03M 1/0626; H03M 1/66; H03M 1/665; H03M 1/82; H03H 17/06; H03H 2017/0081
See application file for complete search history.

(56) References Cited

U.S. PATENT DOCUMENTS

| | | | | |
|---|---|---|---|---|
| 5,550,869 | A * | 8/1996 | Gurantz | H04L 7/0334 375/345 |
| 5,909,463 | A * | 6/1999 | Johnson | H04L 27/0002 455/73 |
| 6,535,073 | B1 * | 3/2003 | Garg | H04L 25/03834 375/295 |
| 7,573,948 | B2 * | 8/2009 | Jensen | H04B 1/04 455/126 |
| 10,340,933 | B1 * | 7/2019 | Hovakimyan | H03M 1/0626 |
| 2008/0212662 | A1 | 9/2008 | Lee et al. | |

FOREIGN PATENT DOCUMENTS

WO    WO-00/49710 A1    8/2000

OTHER PUBLICATIONS

Extended European Search Report on EP 22203322.7 dated Mar. 15, 2023.

* cited by examiner

*Primary Examiner* — Quochien B Vuong
(74) *Attorney, Agent, or Firm* — Foley & Lardner LLP

(57) ABSTRACT

The systems and methods discussed herein related to digital to analog conversion. A digital to analog conversion a compensation circuit and a digital to analog conversion circuit. The compensation circuit includes a filter configured to provide roll off compensation in a baseband frequency using real coefficients. The compensation circuit is configured to convert the first digital signal to a second digital signal so that the second digital signal can be filtered by the filter using the real coefficients.

20 Claims, 6 Drawing Sheets

SYSTEM FOR AND METHOD OF DIGITAL TO ANALOG CONVERSION FREQUENCY DISTORTION COMPENSATION

FIELD OF THE DISCLOSURE

This disclosure generally relates to systems and methods for compensation in digital to analog conversion operations or digital to analog converters (DACs).

BACKGROUND

In the last few decades, the market for integrated circuit devices has grown by orders of magnitude, fueled by the need for portable devices, and increased connectivity and data transfer between all manners of devices. Digital to analog conversion techniques are widely used in integrated circuit devices. DACs are often provided in communication circuits as well as other types of circuits that use both analog and digital signals. Generally, radio frequency transmitters used in wireless base stations include DACs. The DACs convert digital signals into electrical analog signals.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Figure 1:
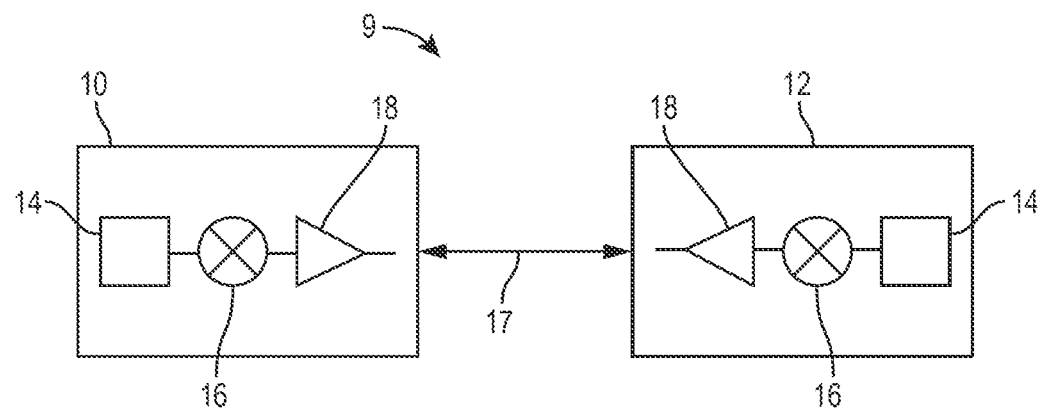
FIG. 1 is a general schematic block diagram of a wired communication system including a digital to analog conversion system with frequency response distortion compensation according to some embodiments.

The following standard(s), including any draft versions of such standard(s), are hereby incorporated herein by reference in their entirety and are made part of the present disclosure for all purposes: 4G LTE, 5G, IEEE 802.11x, IEEE 802.11ad, IEEE 802.11ah, IEEE 802.11aj, IEEE 802.16 and 802.16a, and IEEE 802.11ac, IEEE P802.3™ and Data Over Cable Service Interface Specification Standards (D3.1 and D4.0). Although this disclosure may reference aspects of these standard(s), the disclosure is in no way limited by these standard(s).

For purposes of reading the description of the various embodiments below, the following descriptions of the sections of the specification and their respective contents may be helpful:

Section A describes embodiments of systems and methods for digital to analog conversion; and Section B describes a network environment and computing environment which may be useful for practicing embodiments described herein.

A. Systems and Methods for Digital to Analog Conversion

Digital to analog data converters (DACs) are utilized in various wireless and wired communication devices as well as other mixed signal systems. DACs are also used in processors, microcontrollers and other circuits that process digital data and transmit or process analog signals. In one exemplary application, a 5G direct conversion transmitter uses one or more DACs.

Digital to analog conversion systems with frequency response distortion compensation compensate for roll-off in the digital to analog conversion operation in some embodiments. In some embodiments, the roll off is characterized by a $T_s \sin(\pi f T_s)/(\pi f T_s)$ ($\sin(x)/x$) characteristic, and an inverse sinc filter compensates for the roll off. Some embodiments of the systems and methods of digital to analog conversion system with frequency response distortion compensation utilize a filter that does not run at the DAC sampling rate to match the entire DAC frequency response, thereby not requiring a high number of filter coefficients and higher power consumption. In some embodiments, the digital to analog conversion system with frequency response distortion compensation performs compensation at the baseband frequency (e.g., before up conversion to radio frequency (RF)). In some embodiments, the digital to analog conversion system with frequency response distortion compensation performs compensation at the baseband frequency (e.g., before up conversion to radio frequency or transmission frequency) without requiring complex-value baseband finite infinite response (FIR) filtering which requires more filter coefficients and power consumption than real value baseband FIR filtering. In some embodiments, the systems and methods of digital to analog conversion system with frequency response distortion compensation use real value baseband FIR filtering.

Some embodiments relate to an apparatus. The apparatus includes a compensation circuit and a digital to analog conversion circuit. The compensation circuit includes a filter configured to provide roll off compensation in a baseband frequency using real coefficients. The compensation circuit is configured to convert the first digital signal to a second digital signal so that the second digital signal can be filtered by the filter using the real coefficients. The digital to analog conversion circuit includes a digital input configured to receive a filtered signal from the filter or a first version of the filtered signal and provide an analog signal at an analog output.

Some embodiments relate to a method. The method includes rotating digital signals having real and imaginary values to provide digital signals in a real domain, filtering the digital signals in the real domain to provide distortion compensated signals, and derotating the distortion compensated signals. The method also includes converting the distortion compensated signals to analog signals.

Some embodiments relate to a transmitter. The transmitter includes a compensation circuit including a rotator, a filter, and a derotator. The rotator is configured to receive an in-phase digital signal and a quadrature digital signal and provide a rotated in-phase signal and a rotated quadrature signal. The filter is configured to receive the rotated in-phase signal and the rotated quadrature signal and provide a filtered in-phase signal and a filtered quadrature signal. The derotator is configured to receive the filtered in-phase signal and the filtered quadrature signal and provide a derotated in-phase signal and a derotated quadrature signal. The transmitter also includes a frequency converter configured to receive the derotated in-phase signal and the derotated quadrature signal and provide an up converted in-phase signal and an up converted quadrature signal. The transmitter also includes a digital to analog converter configured to receive the up converted in-phase signal and the up converted quadrature signal and provide an analog signal at an analog output.

Some embodiments relate to an apparatus. The apparatus includes a compensation circuit and a digital to analog conversion circuit. The compensation circuit includes a filter configured to provide roll off compensation in a baseband frequency. The compensation circuit is configured to provide two paths through the filter. A first path through the filter filters first values, and a second path through the filter filters second values. The second values are coefficients of the square root of negative one. The digital to analog conversion circuit includes a digital input configured to receive a filtered signal from the filter or a first version of the filtered signal and provide an analog signal at an analog output.

Figure 2:
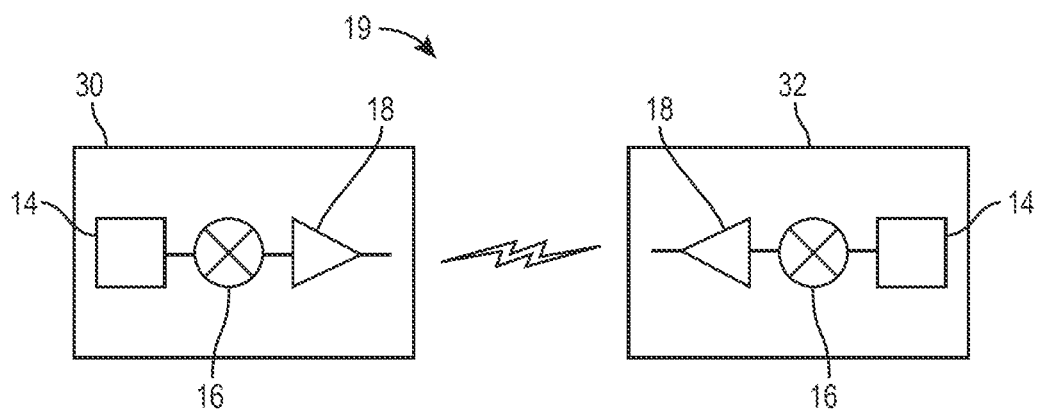
FIG. 2 is a general schematic block diagram of a wireless communication system including a digital to analog conversion system with frequency response distortion compensation according to some embodiments.

With reference to FIG. 1, a communication system 9 includes a first transceiver 10 and second transceiver 12 in communication via a twisted pair conductive medium, a single-pair conductive medium, a coaxial cable, an optical cable or a conductor 17 in some embodiments. In some embodiments, a communication system 19 includes a first transceiver 30 and second transceiver 32 in communication via wireless communication system (FIG. 2) and does not include conductor 17. The communication systems 9 and 19 can be any type of communication system including but not limited to a wireless network (e.g., 4G LTE or 5G), Data Over Cable Service Interface Specification (DOCSIS) system, an Ethernet system, an automotive communications system, an 802.11 system, etc. Conductor 17 can be a single ended conductor or a differential pair of conductors and can be any communication medium for communications in some embodiments.

The transceivers 10, 12, 30 and 32 may be part of other devices (not illustrated), such as access points, vehicle components, television systems, satellite systems, cable modems, telephonic devices, computing devices, cameras, displays, network devices, or any other type and form of electronic device utilizing a communications system. The transceivers 10, 12, 30 and 32 can be part of local area networks, wide area networks, and include DOCSIS transmitters, Ethernet transmitters, wireless transmitters, or other communication circuits.

The transceivers 10, 12, 30, and 32 each include a digital to analog conversion system with frequency response distortion compensation including a compensation circuit 14, an up converter 16, and a DAC 18 in some embodiments. Digital signals are provided to compensation circuit 14 which provides compensation for distortion (e.g., roll off). In some embodiments, the compensation is performed by an inverse sin c(x) filter in the baseband frequency. The inverse sin c(x) filter is implemented as a real value baseband FIR filter in some embodiments. The filtered digital signal is up converted by up converter 16 and provided to DAC 18. DAC 18 converts the up converted digital signal to provide an analog signal. The up converter 16 is a digital mixing circuit and can also include an interpolator in some embodiments.

Figure 3:
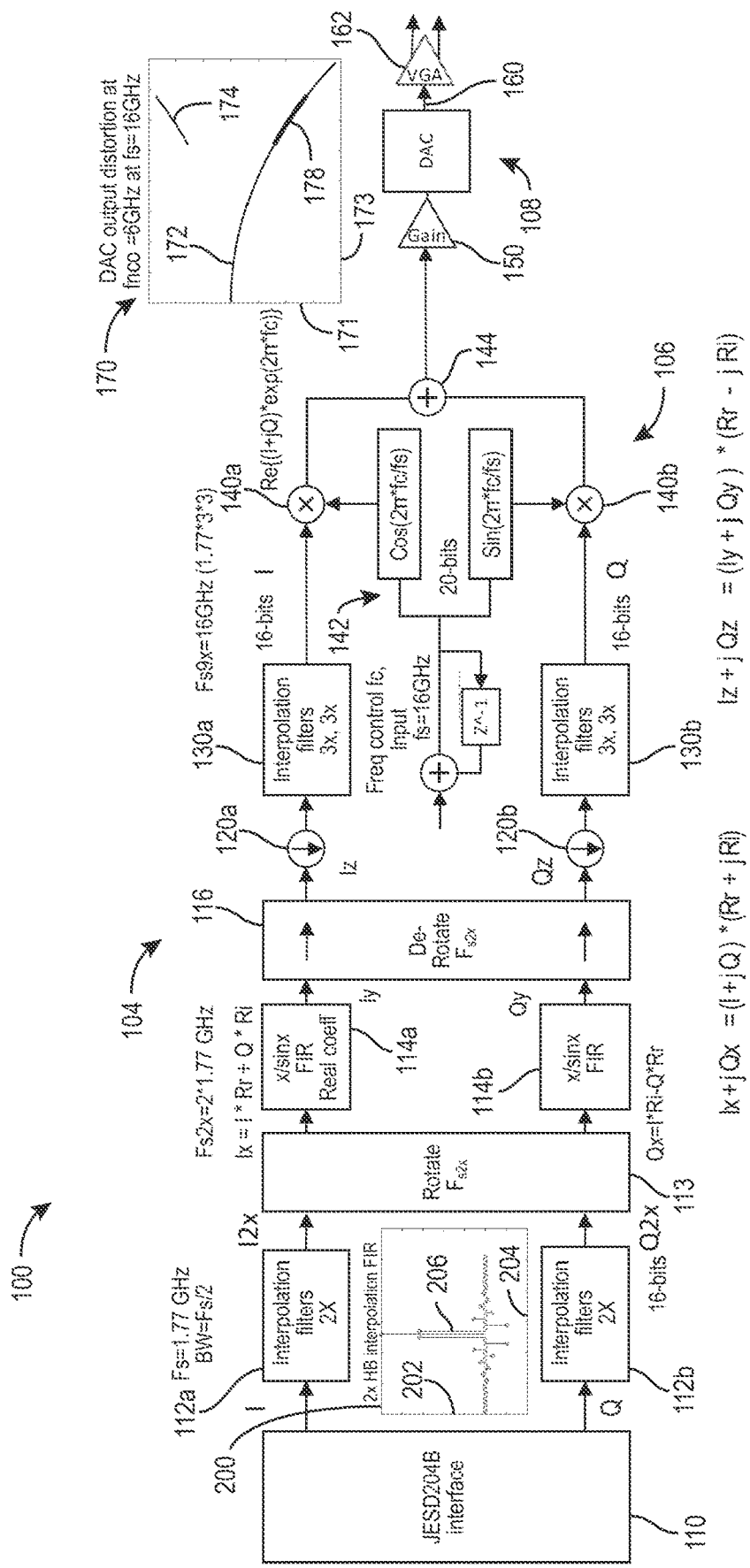
FIG. 3 is a more detailed schematic block diagram of a digital to analog conversion system with frequency response distortion compensation for use in the communication systems illustrated in FIG. 1 or 2 according to some embodiments.

With reference to FIG. 3, a digital to analog conversion system with frequency response distortion compensation 100 is provided on a physical (PHY) chip or integrated circuit (IC) in a package. In some embodiments, digital to aFnalog conversion system with frequency response distortion compensation 100 is a one chip design and can be used as digital to analog conversion system with frequency response distortion compensation in transceivers 10, 12, 30, and 32. The digital to analog conversion system with frequency response distortion compensation 100 can be part of a transmitter and can be a radio frequency DAC device (e.g., in a direct conversion transceiver). The systems and methods described herein with respect to digital to analog conversion system with frequency response distortion compensation 100 can be used for a variety of different DAC architectures in a wide range of devices including but not limited to devices used in high-speed and high-resolution applications.

The digital to analog conversion system with frequency response distortion compensation 100 includes a compensation circuit 104, an up converter circuit 106 and a DAC 108. The compensation circuit 104, up converter circuit 106 and DAC 108 can be similar to compensation circuit 14, up converter 16, and DAC 18 (FIGS. 1-2), respectively, in some embodiments. Compensation circuit 104 receives a baseband digital signal and provides a compensated digital signal to up converter 16. Up converter 16 converts the compensated digital signal from baseband to a frequency higher than baseband. The higher frequency and baseband frequency are in the Gigahertz (GHz) range in some embodiments. In some embodiments, the baseband is less than the transmission frequency for the analog signal (e.g., in direct converter applications).

Compensation circuit 104 includes a digital interface 110, an interpolation filter 112a, an interpolation filter 112b, a rotate circuit 113, an x/sin(x) FIR filter 114a, an x/sin(x) FIR filter 114b, and a derotate circuit 116. Digital interface 110 is a JESD2048B interface and is coupled to a digital signal source such as an ASIC, modem, storage device, user interface, or other source of digital signals in some embodiments. Digital interface 110 provides an in-phase digital signal and a quadrature digital signal to interpolation filters 112a-b, respectively.

The digital signals are sampled at a sampling frequency of $F_s$. The sampling frequency $F_s$ can be a sampling frequency between 0.5 and 3 Gigahertz (GHz) (e.g., 1.77 GHz) for the baseband signals in some embodiments. The sampled digital signals are up-sampled and filtered by interpolation filters 112a-b. Filters 112a-b have a response 206 as shown in diagram 200 having a Y-axis 202 representing magnitude and an X-axis 204 representing time in some embodiments. Filters 112a-b are 2× half band(HB) interpolation FIR filters and provide 16 bit I and Q interpolated signals at $F_{s2x}=2F_s$ in some embodiments. The interpolated signals are up-sampled by the filters 112a-b and the output of the interpolation filters 112a-b is defined as $z_{2x}=I_{2x}+j*Q_{2x}$ in some embodiments. Filters 112a-b can interpolate by a factor of N and provide the combination of upsampling via zero padding (e.g., putting zeros between samples) and filtering.

The interpolated signals from filters 112a-b are provided to a rotate circuit 113. Rotate circuit 113 frequency shifts the interpolated digital signals by multiplying by $rot(n)=e^{j2\pi nF/F_{s2x}}$ which can be represented as:

$$y_{2x}(n)=z_{2x}(n)e^{j2\pi nF/F_{s2x}}$$

where: $rot(n)=\cos(2\pi nF/F_{s2x})+j*\sin(2\pi nF/F_{s2x})$. The $\cos(2\pi nF/F_{s2x})+j*\sin(2\pi nF/F_{s2x})$ sequence can be stored in a look-up table (LUT) which repeats every 4 cycles as given in Table 1, where $F=F_{s2x}/4$, and n is the symbol index, in some embodiments. Other sequences are possible.

TABLE 1

Complex-valued frequency shift LUT for $F = F_{s2x}/4$

| n | $\cos(2*\pi*n*F/F_{s2x})$ | $j * \sin(2*\pi*n*F/F_{s2x})$ |
|---|---|---|
| 0 | 1 | 0 |
| 1 | 0 | 1 |
| 2 | −1 | 0 |
| 3 | 0 | −1 |

Advantageously, the multiplication with this sequence requires only addition/negation and multiplexing operations in hardware in some embodiments. The real term {y2x} and the imaginary term {y2x} are separately applied to identical inverse sin c(x)(x/sin(x)) compensation digital FIR filter blocks or filters 114a-b. If the either the bandwidth of the signal or the carrier frequency changes, then the corresponding pre-designed DAC compensation filter coefficients can be loaded into the FIR filters 114a-b. By performing the frequency shift, the band of interest is not a complex envelope centered on direct current (DC) and is a real signal in some embodiments. By using real signals and real filter coefficients, complex filter taps are avoided and fewer taps (e.g., 15) are used in some embodiments. In some embodiments, FIR filters 114a-b use less than 32 taps total and all coefficients are real coefficients (e.g., not complex coefficients containing real and imaginary values).

Derotate circuit 116 frequency shifts the digital compensated signal from FIR filters 114a-b by multiplying the digital compensated signal by the signal $e^{-j2\pi n/4}$ at the sampling rate of $F_{s2x}$. A similar look up table can be used to derotate the filtered signal. The signals Ix, Qx, Iy, Qy, Iz and Qz are all real signals where I+jQ is a complex representation for the real signals. The derotate circuit 116 provides Iz and Qz signals centered about DC. The output of the derotate circuit 116 are down sampled by 2 and provided to 3×3 interpolation filters 130a-b (e.g., zero padding and filtering are performed) which provide 16-bit signals at the sampling rate of $F_s$x9 (e.g., 16 GHz) and at signal frequency of 6 GHz in some embodiments. Filters 130a-b provide the interpolated digital signals to mixers 140a-b which provide up converted signals to summer 144.

Up converter circuit 106 includes circuit 142, mixers 140a-b and summer 144. Filters 130a-b provide the interpolated signals at the mixer data rate for multiplication by the numerically controlled oscillator carrier frequency signals from circuit 142. The numerically controlled oscillator carrier frequency signals are 20-bit signals. A modulated real value output signal is applied as input to the DAC 108. DAC 108 provides a modulated 6 GHz frequency signal in some embodiments.

A diagram 170 shows the DAC output response on a line 172 where a Y axis is amplitude and an X-axis is frequency. A line 178 represents the signal frequency of interest and is part of a roll off characteristic of response shown by line 172. Compensation circuit 104 provides compensation as represented by line 174 which flattens out the response associated shown by line 178. Advantageously, only a small portion of the roll off characteristic is compensated in some embodiments. Compensation at other frequencies is achieved by adjusting coefficients for filters 114a-b. Coefficients can be changed by loading firmware with new coefficients (e.g., for the appropriate mixer frequency) in some embodiments.

Summer 144 provides the digital summed digital signal to an amplifier 150. DAC 108 converts the amplified signal to an analog signal provided at an output 160 for reception by variable gain amplifier 162. The DAC 108 can be a current mode or voltage mode conversion circuit. The DAC 108 operates at a sampling rate of $9XF_s$ in some embodiments.

In some embodiments, the digital components of digital to analog conversion system with frequency response distortion compensation 100 can be implemented using dedicated or non-dedicated circuits or processor based circuits including, but not limited to: a central processing unit (CPU), graphics processing unit (GPU), microprocessor, application specific integrated circuit (ASIC), a field programmable gate array (FPGA), complementary metal-oxide-semiconductor (CMOS), or the like. In some examples, a memory for storing data and computer instructions is included, such as random-access memory (RAM), read-only memory (ROM), programmable read-only memory (PROM), erasable programmable read-only memory (EPROM), and electrically erasable programmable read-only memory (EEPROM), dynamic random-access memory (DRAM), static random-access memory (SRAM), Flash memory, or the like. Hardware for filters 130a, 130b, 112a, 112b can advantageously be part of a system design of a larger device and not require additional hardware in some embodiments.

Figure 4:
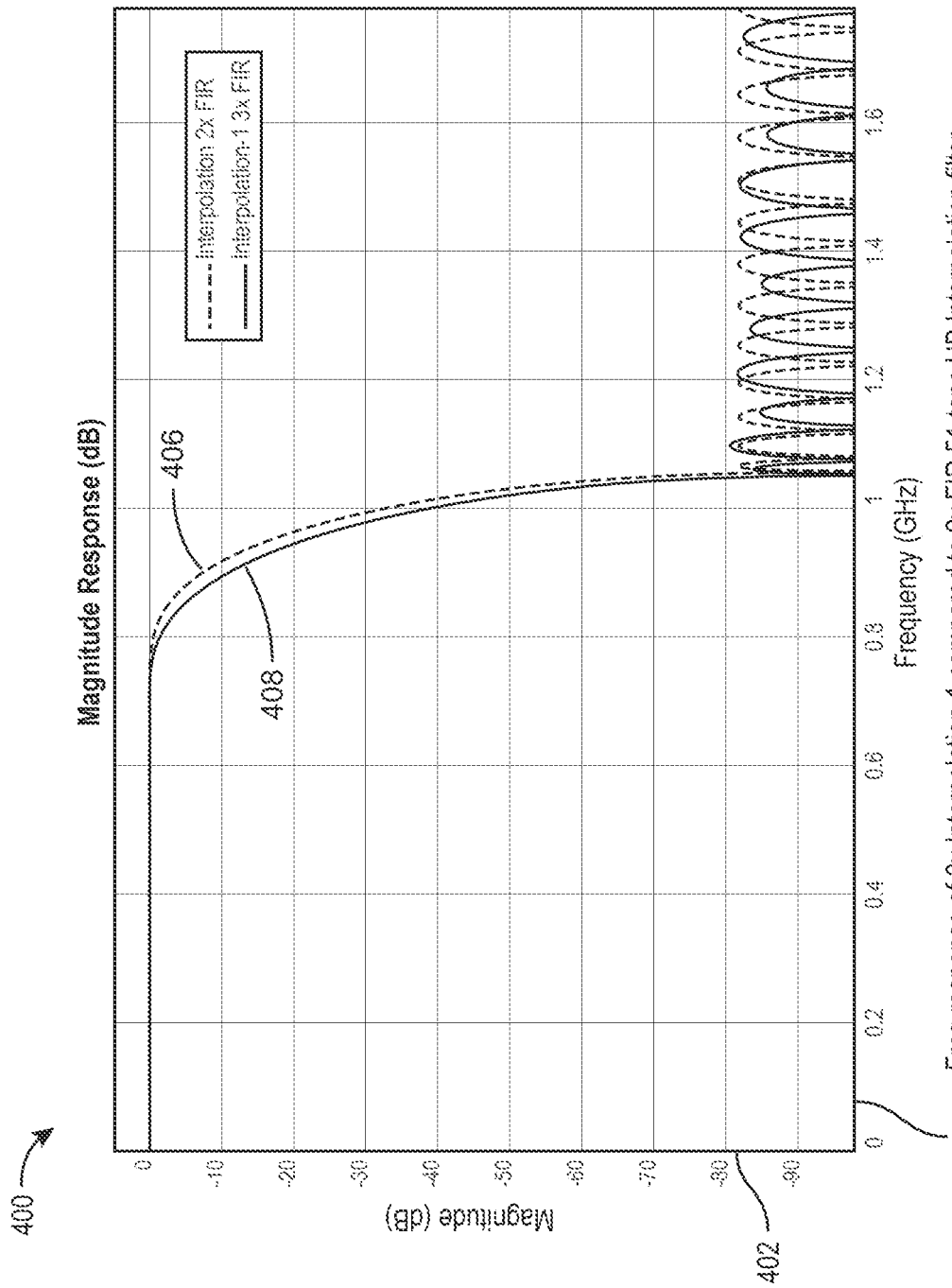
FIG. 4 is a diagram of a frequency response of a 3 times interpolation-1 filter compared to a 2 times interpolation filter applied before an exemplary baseband x/sinx FIR filter for the digital to analog conversion system with frequency response distortion compensation illustrated in FIG. 3 according to some embodiments.

With reference to FIG. 4, a diagram 400 includes a Y-axis 402 representing amplitude in decibels (dB) and an X-axis 404 representing frequency in GHz. A solid line 408 represents an estimated response for a 3× interpolation FIR filter (filters 130a-b) applied before an exemplary baseband x/sinx FIR filter for the digital to analog conversion system with frequency response distortion compensation illustrated in FIG. 3 and line 406 represents an estimated response for 2× interpolation-1 FIR filter (filters 112a-b).

Figure 5:
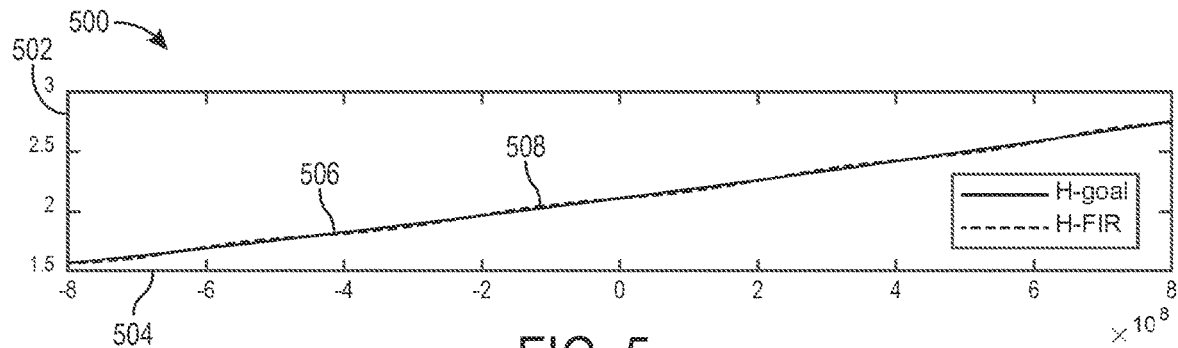
FIG. 5 is a diagram of—a baseband equivalent of a desired x/sinx filter response that compensates the DAC distortion in the desired-mixer frequency of the digital to analog conversion system with frequency response distortion compensation illustrated in FIG. 3 and a response of a baseband x/sinx FIR filter according to some embodiments.

With reference to FIG. 5, a diagram 500 includes a Y-axis 502 representing amplitude in decibels (dB) and an X-axis 504 representing frequency across DC. A solid line 506 represents a desired response for a transfer function (H) goal (e.g., portion associated with line 174 in FIG. 3) and a dashed line 508 represents an estimated response for the transfer function (H) of a FIR filter (e.g. the response of filters 114a-b).

Figure 6:
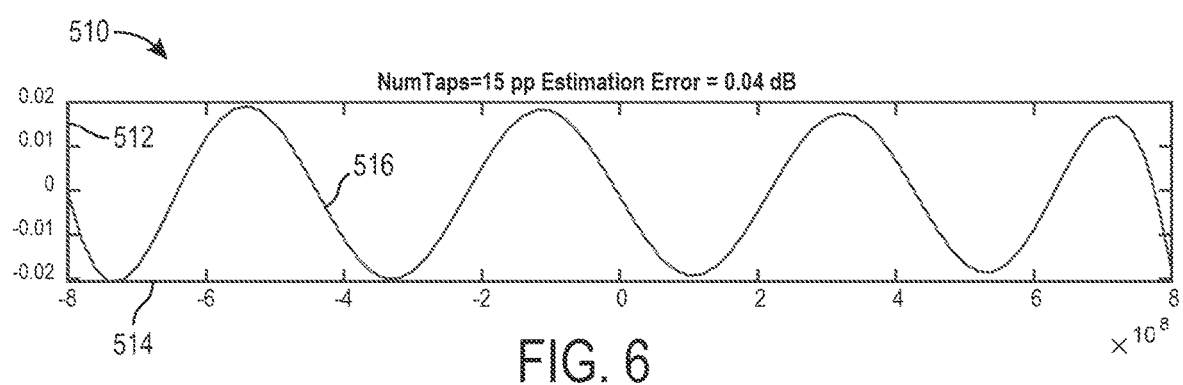
FIG. 6 is a diagram of an output-residue error between the desired x/sinx filter response and the x/sinx FIR filter response in dB of an exemplary filter for the digital to analog conversion system with frequency response distortion compensation illustrated in FIG. 3 according to some embodiments.

With reference to FIG. 6, a diagram 510 includes a Y-axis 512 representing amplitude in decibels (dB) and an X-axis 514 representing frequency. A solid line 516 represents a residual error between solid line 506 and dashed line 508 for a FIR filter (e.g., filters 114a-b). The estimation error is approximately sinusoidal with a magnitude of 0.04 dB.

Figure 7:
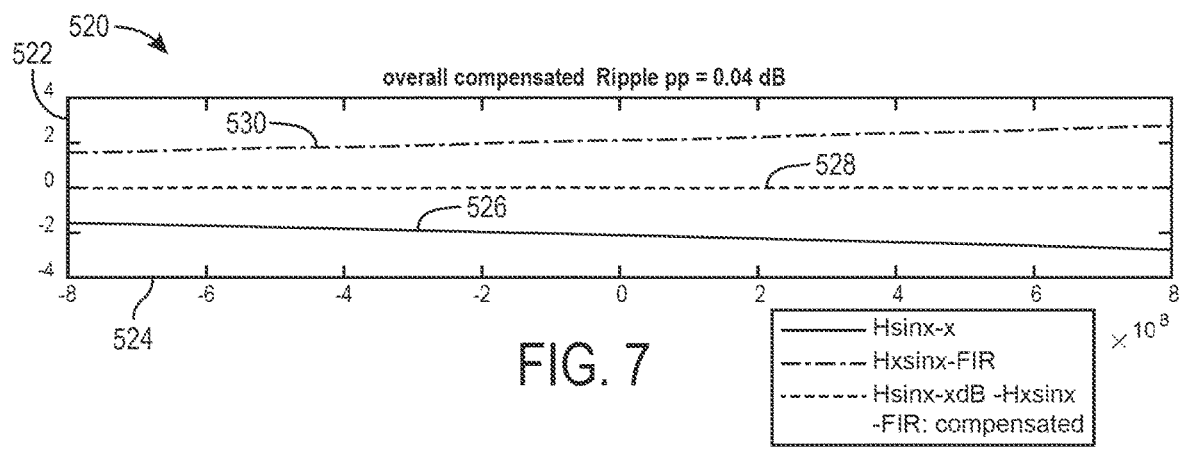
FIG. 7 is a diagram of DAC distortion, x/sinx compensation and combined responses for the digital to analog conversion system with frequency response distortion compensation illustrated in FIG. 3 according to some embodiments.

With reference to FIG. 7, a diagram 520 includes a Y-axis 522 representing amplitude in decibels (dB) and an X-axis 524 representing frequency. A solid line 526 represents a response for a sin x/x (e.g., corresponding to the roll off characteristic associated with line 178). A dashed line 530 represents a response for an x/sin x FIR filter (e.g., filters 114a-b). A dashed line 528 represents a response for a sin x/x—x/sin x FIR filter (the difference between lines 526 and 530). The flatness of line 528 shows appropriate compensation.

Figure 8:
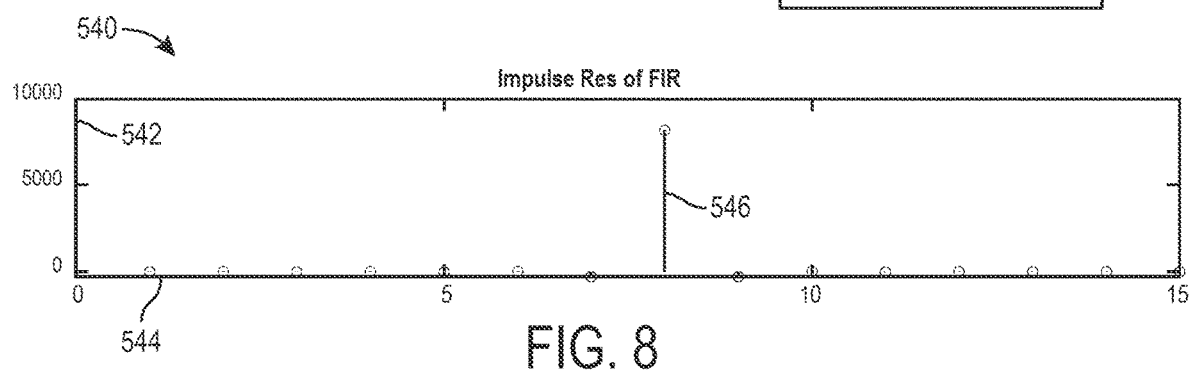
FIG. 8 is a diagram of impulse response of an exemplary filter for the digital to analog conversion system with frequency response distortion compensation illustrated in FIG. 3 according to some embodiments.

With reference to FIG. 8, a diagram 540 includes a Y-axis 542 representing amplitude and an X-axis 544 representing time. A solid line 546 represents an impulse response for a FIR filter (e.g., filters 114a-b).

Figure 9:
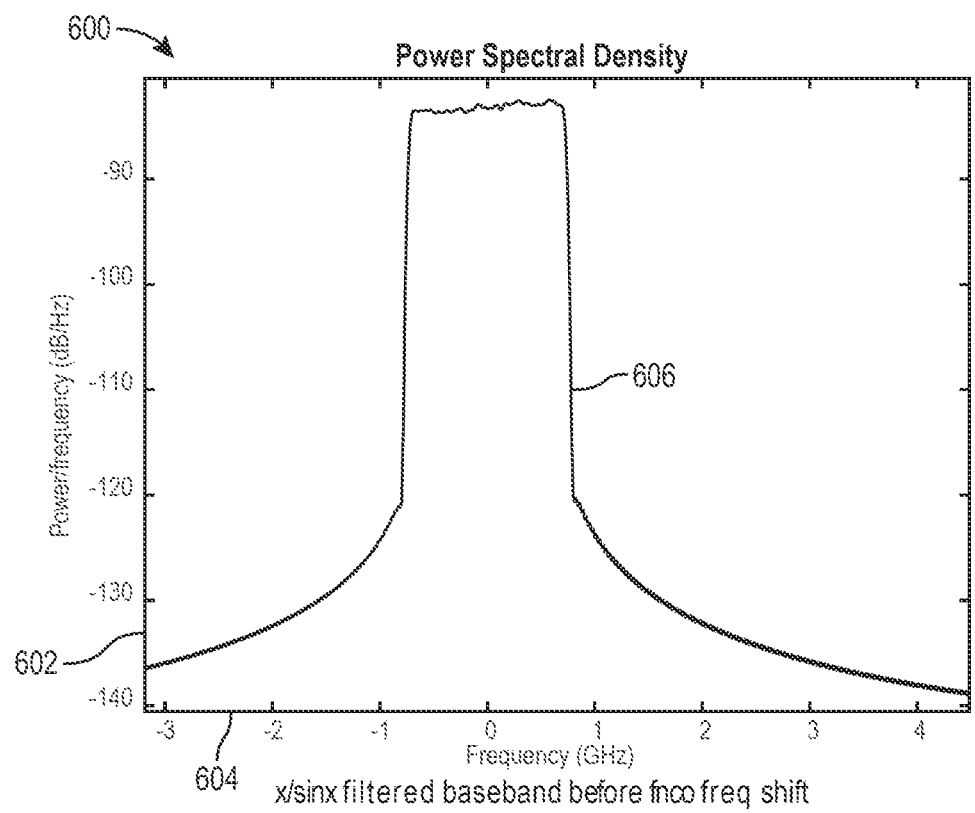
FIG. 9 is a diagram of the power spectral density at baseband frequency for an exemplary filter for the digital to analog conversion system with frequency response distortion compensation illustrated in FIG. 3 versus frequency according to some embodiments.
Figure 10:
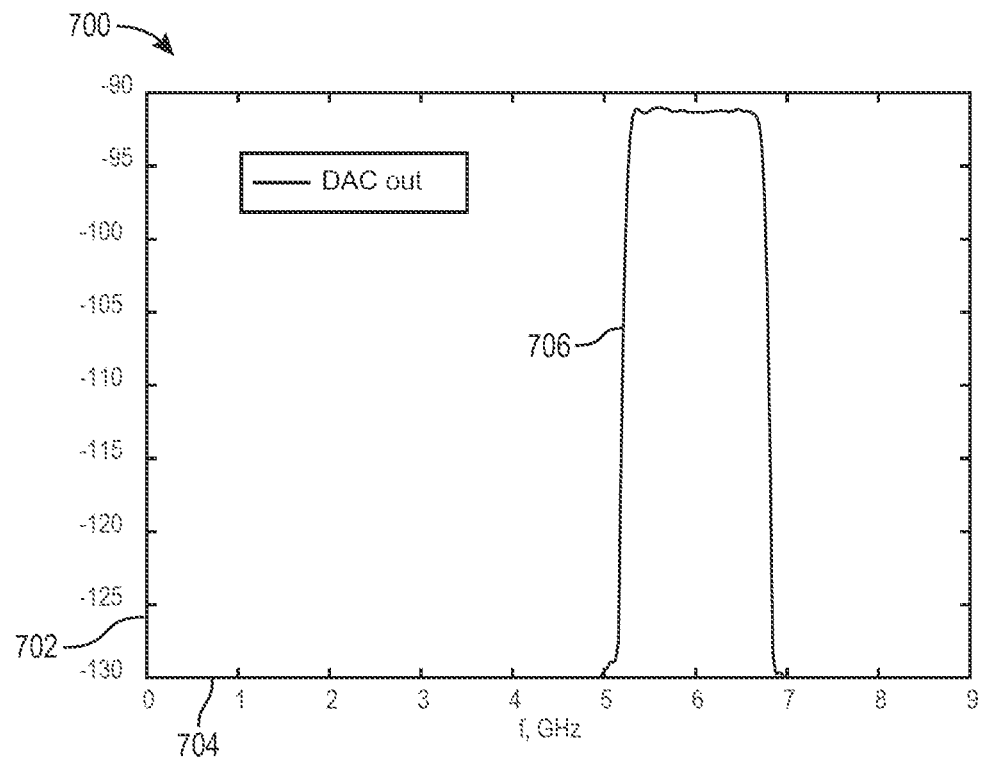
FIG. 10 is a diagram of the power spectral density at radio frequency of the output of the digital to analog converter system with frequency response distortion compensation illustrated in FIG. 3 versus frequency according to some embodiments.

With reference to FIG. 9, a diagram 600 includes a Y-axis 602 representing power divided by frequency in decibels (dB) and an X-axis 604 representing frequency. A solid line 606 represents a power spectral density for the signal before input to mixers 140a-b (FIG. 3). With reference to FIG. 10, a diagram 700 includes a Y-axis 702 representing power divided by frequency in decibels (dB), and an X-axis 704 representing frequency in GHz. A solid line 706 represents a power spectral density for the signal after mixers 140a-b (FIG. 3) at output 160. The responses and estimations shown in FIG. 5-10 are exemplary only.

Figure 11:
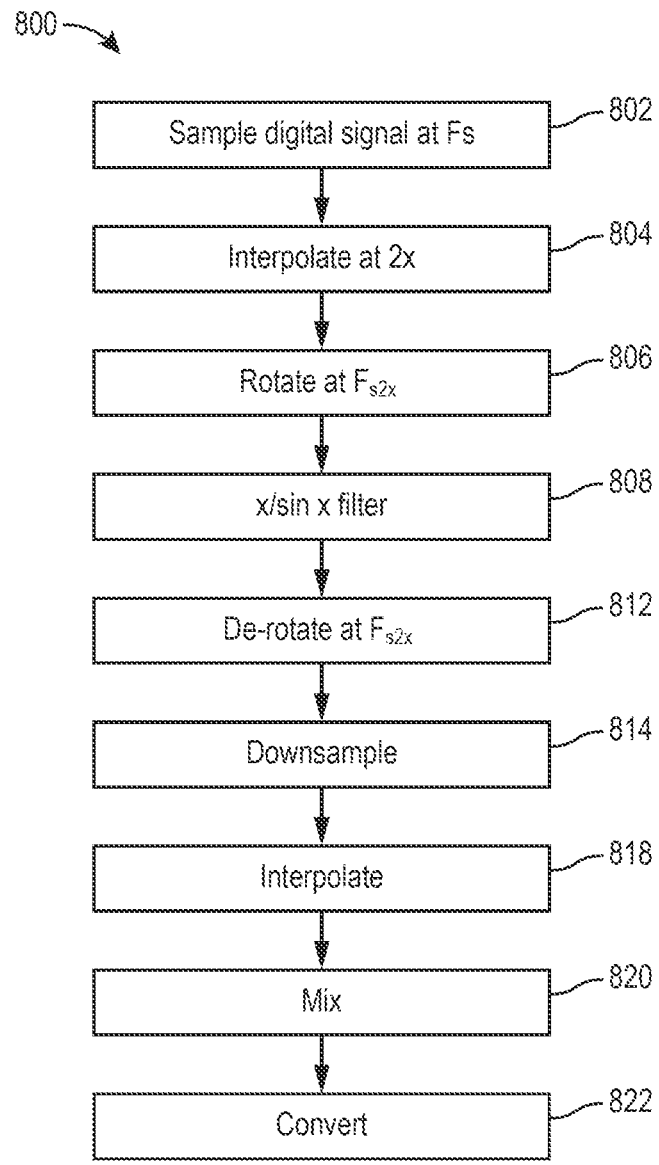
FIG. 11 is a flow diagram showing exemplary operations performed by the digital to analog conversion system with frequency response distortion compensation illustrated in FIG. 3 according to some embodiments.

With reference to FIG. 11, a flow 800 can be performed by digital to analog conversion system with frequency response distortion compensation 100. Flow 800 includes an operation 802 where digital signals (I and Q in some embodiments) are sampled at a rate $F_s$. At an operation 804, the digital signals are interpolated to provide 2× $F_s$ samples. At an operation 806, the interpolated digital signals are rotated by $F_{s2x}/4$ to provide the digital signals as real values. At an operation 808, the rotated digital signals are filtered by an x/sin(x) filter. At an operation 812, the digital signals are derotated. Down sampling and interpolation stages can be combined to save computation time and resources. At an operation 814, the digital signals are down sampled to provide 1×$F_s$ samples. At an operation 818, the digital signals are interpolated to provide 9×$F_s$ samples. At an operation 820, the digital signals are mixed to up convert the signals to a higher frequency range. At an operation 822, the digital signals are converted to analog signals.

B. Computing and Network Environment

Having discussed specific embodiments of the present solution, it may be helpful to describe aspects of the operating environment as well as associated system components (e.g., hardware elements) in connection with the methods and systems described herein. Network environment includes a wired or a wireless communication system that includes one or more access points, one or more wireless communication devices which can include transceivers 10, 12, 30, and 32 and a network hardware component. The network environment can include (DOCSIS) modems that enable high-bandwidth data transfer via existing coaxial cable systems associated with the transmission of cable television program signals (CATVS). The wireless communication devices may for example include televisions, laptop computers, tablets, personal computers and/or cellular telephone devices. The network environment can be an Ethernet, an ad hoc network environment, an infrastructure wireless network environment, a subnet environment, etc. in one embodiment.

The access points (APs) may be operably coupled to the network hardware via local area network connections. The network hardware, which may include a router, gateway, switch, bridge, modem, system controller, appliance, etc., may provide a local area network connection for the communication system. Each of the access points may have an associated antenna or an antenna array to communicate with the wireless communication devices in its area. The wireless communication devices may register with a particular access point to receive services from the communication system (e.g., via a SU-MIMO or MU-MIMO configuration). For direct connections (e.g., point-to-point communications), some wireless communication devices may communicate directly via an allocated channel and communications protocol. Some of the wireless communication devices may be mobile or relatively static with respect to the access point.

The network connections may include any type and/or form of network and may include any of the following: a point-to-point network, a broadcast network, a telecommunications network, a data communication network, a computer network. The topology of the network may be a bus, star, or ring network topology. The network may be of any such network topology as known to those ordinarily skilled in the art capable of supporting the operations described herein. In some embodiments, different types of data may be transmitted via different protocols. In other embodiments, the same types of data may be transmitted via different protocols.

The digital to analog conversion system with frequency response distortion compensation can include central processing unit and digital signal processors is any logic circuitry that responds to and processes instructions fetched from a memory. Memory can be any type or variant of Static random access memory (SRAM), Dynamic random access memory (DRAM), Ferroelectric RAM (FRAM), NAND Flash, NOR Flash and Solid State Drives (SSD).

Although examples of communications systems described above may include devices and APs operating according to an 802.11 standard, it should be understood that embodiments of the systems and methods described can operate according to other standards and use wireless communications devices other than devices configured as devices and APs. For example, multiple-unit communication interfaces associated with cellular networks, satellite communications, vehicle communication networks, and other non-802.11 wireless networks can utilize the systems and methods described herein to achieve improved overall capacity and/or link quality without departing from the scope of the systems and methods described herein.

It should be noted that certain passages of this disclosure may reference terms such as "first" and "second" in connection with devices, mode of operation, transmit chains, antennas, etc., for purposes of identifying or differentiating one from another or from others. These terms are not intended to merely relate entities (e.g., a first device and a second device) temporally or according to a sequence, although in some cases, these entities may include such a relationship. Nor do these terms limit the number of possible entities (e.g., devices) that may operate within a system or environment.

It should be understood that the systems described above may provide multiple ones of any or each of those components and these components may be provided on either a standalone machine or, in some embodiments, on multiple machines in a distributed system. For example, any type of interpolation filter can be used. Half band filters are particularly efficient, because approximately half the coefficients are zero. In addition, the systems and methods described above may be provided as one or more computer-readable programs or executable instructions embodied on or in one or more articles of manufacture. The article of manufacture may be a floppy disk, a hard disk, a CD-ROM, a flash memory card, a PROM, a RAM, a ROM, or a magnetic tape. In general, the computer-readable programs may be implemented in any programming language, such as LISP, PERL, C, C++, C#, PROLOG, or in any byte code language such as JAVA. The software programs or executable instructions may be stored on or in one or more articles of manufacture as object code.

While the foregoing written description of the methods and systems enables one of ordinary skill to make and use what is considered presently to be the best mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

The transmitter and digital to analog conversion system with frequency response distortion compensation has been described above with the aid of functional building blocks illustrating the performance of certain significant functions. The boundaries of these functional building blocks have been arbitrarily defined for convenience of description. Functions and structures can be integrated together across such boundaries. Alternate boundaries could be defined as long as the certain significant functions are appropriately performed. Similarly, flow diagram blocks may also have been arbitrarily defined herein to illustrate certain significant functionality. To the extent used, the flow boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The invention claimed is:

1. An apparatus, comprising:
   a compensation circuit comprising a filter configured to provide roll off compensation in a baseband frequency using real coefficients, wherein the compensation circuit is configured to convert a first digital signal to a second digital signal so that the second digital signal can be filtered by the filter using the real coefficients; and
   a digital to analog conversion circuit comprising a digital input configured to receive a filtered signal from the filter or a first version of the filtered signal and provide an analog signal at an analog output, wherein the compensation circuit further comprises a rotation circuit configured to receive the first digital signal and provide the second digital signal, wherein the compensation circuit further comprises a derotation circuit configured to receive the filtered signal and provide the first version of the filtered signal.

2. The apparatus of claim 1, further comprising a mixing circuit disposed between the filter and the digital to analog conversion circuit and configured to up convert the filtered signal or a second version of the filtered signal and provide the first version of the filtered signal to the digital input as an up converted signal at a higher frequency than the baseband frequency.

3. The apparatus of claim 2, wherein the apparatus is part of a direct transmitter provided in a single chip device.

4. The apparatus of claim 1, wherein the filter comprises less than 32 tap coefficients.

5. The apparatus of claim 4, wherein the real coefficients do not include imaginary values.

6. The apparatus of claim 1, wherein the second digital signal comprises a rotated in-phase signal and a rotated quadrature signal.

7. The apparatus of claim 6, the first version of the filtered signal comprises a derotated in-phase signal and a derotated quadrature signal.

8. A method comprising:
   upsampling and rotating digital signals having real and imaginary values to provide digital signals in a real domain;
   filtering the digital signals in the real domain to provide distortion compensated signals;
   derotating the distortion compensated signals to provide derotated distortion compensated signals; and
   converting the derotated distortion compensated signals to analog signals.

9. The method of claim 8, wherein the distortion compensated signals digital signals are derotated to have real and imaginary components.

10. The method of claim 8, further comprising:
    mixing the derotated distortion compensated signals to be in a higher frequency range before converting.

11. The method of claim 8, wherein filtering is performed by a FIR filter.

12. The method of claim 8, wherein filtering is performed by an x/sin(x) filter at baseband.

13. The method of claim 8, wherein the digital signals comprise in phase signals and quadrature signals.

14. The method of claim 8, wherein the distortion compensated signals reduce a roll off characteristic of a digital to analog converter.

15. A transmitter, comprising:
    a compensation circuit comprising a rotator, a filter, and a derotator, wherein the rotator is configured to receive an in-phase digital signal and a quadrature digital signal and provide a rotated in-phase signal and a rotated quadrature signal, wherein the filter is configured to receive the rotated in-phase signal and the rotated quadrature signal and provide a filtered in-phase signal and a filtered quadrature signal, the filter being configured to compensate for digital to analog conversion distortion, wherein the derotator is configured to receive the filtered in-phase signal and the filtered quadrature signal and provide a derotated in-phase signal and a derotated quadrature signal;

a frequency converter configured to receive the derotated in-phase signal and the derotated quadrature signal and provide an up converted in-phase signal and an up converted quadrature signal; and a digital to analog converter configured to receive the up converted in-phase signal and the up converted quadrature signal and provide an analog signal at an analog output.

16. The transmitter of claim 15, wherein the filter has a response for compensating for conversion roll off and is comprised of a first FIR filter and a second FIR filter.

17. The transmitter of claim 16, wherein the filter is configured to have a response that compensates for digital to analog conversion distortion at baseband.

18. The transmitter of claim 16, wherein the filter is x/sin(x) FIR filter.

19. The transmitter of claim 16, wherein the filter has 32 or less coefficients.

20. The transmitter of claim 16, wherein the filter has 16 or less real coefficients.

\* \* \* \* \*